US010345849B2

(12) United States Patent
Sinthomez et al.

(10) Patent No.: US 10,345,849 B2
(45) Date of Patent: Jul. 9, 2019

(54) ROTARY CONTROL SYSTEM FOR A DEVICE

(71) Applicant: SCHNEIDER ELECTRIC INDUSTRIES SAS, Rueil Malmaison (FR)

(72) Inventors: Daniel Sinthomez, Domene (FR); Florent Pitis, Brie et Angonnes (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 240 days.

(21) Appl. No.: 15/400,493

(22) Filed: Jan. 6, 2017

(65) Prior Publication Data

US 2017/0242453 A1 Aug. 24, 2017

(30) Foreign Application Priority Data

Feb. 19, 2016 (FR) ..................................... 16 51363

(51) Int. Cl.
*G05G 5/28* (2006.01)
*H01H 9/28* (2006.01)
(Continued)

(52) U.S. Cl.
CPC ................. *G05G 5/28* (2013.01); *G05G 1/10* (2013.01); *H01H 9/281* (2013.01); *H01H 19/14* (2013.01);
(Continued)

(58) Field of Classification Search
CPC ............ G05G 5/28; G05G 1/10; H01H 9/281; H01H 19/14
(Continued)

(56) References Cited

U.S. PATENT DOCUMENTS 6,423,912 B1 7/2002 Arenz et al.
2005/0224324 A1 10/2005 Bortolloni et al.
(Continued)

FOREIGN PATENT DOCUMENTS

DE 199 39 717 A1 2/2001
EP 1 583 120 A1 10/2005
EP 1 791 149 A2 5/2007

OTHER PUBLICATIONS

French Preliminary Search Report dated Oct. 26, 2016 in French Application 16 51363 filed on Feb. 19, 2016 (with English Translation of Categories of Cited Documents).

*Primary Examiner* — Renee S Luebke
*Assistant Examiner* — Iman Malakooti
(74) *Attorney, Agent, or Firm* — Oblon, McClelland, Maier & Neustadt, L.L.P.

(57) ABSTRACT

This rotary control system for a device includes a rotary control member, rotationally mobile about a first fixed axis, between first and second positions, and a rotary control handle, intended to be secured in rotation with the rotary member about the first axis. It also includes a blocking device, that can be selectively moved, when the rotary member is in its first position, between a blocking configuration, in which it prevents the movement of the rotary member to its second position, and a release configuration, wherein the movement of the rotary member to its second position. This system further includes a locking plate, rotationally mobile about the first axis relative to the rotary member, when the rotary member is in its first position, between a locking position, in which a first orifice passing through the rotary member is superposed with a second orifice passing through the locking plate.

10 Claims, 4 Drawing Sheets

(51) Int. Cl.
*H01H 71/56* (2006.01)
*G05G 1/10* (2006.01)
*H01H 19/14* (2006.01)
*H01H 19/36* (2006.01)
*H05K 5/00* (2006.01)
*H05K 5/02* (2006.01)

(52) U.S. Cl.
CPC ............ *H01H 19/36* (2013.01); *H01H 71/56* (2013.01); *H05K 5/0017* (2013.01); *H05K 5/02* (2013.01); *G05G 2505/00* (2013.01); *H01H 2071/565* (2013.01); *H01H 2235/01* (2013.01)

(58) Field of Classification Search
USPC ........................................................ 200/43.11
See application file for complete search history.

(56) References Cited

U.S. PATENT DOCUMENTS

| | | | | |
|---|---|---|---|---|
| 2007/0119220 | A1 | 5/2007 | Maquet | |
| 2015/0122627 | A1* | 5/2015 | Pora | H01H 19/08<br>200/572 |

* cited by examiner

ROTARY CONTROL SYSTEM FOR A DEVICE

The invention relates to a rotary control system for an apparatus. The invention relates also to an electrical enclosure comprising a controllable electrical apparatus and such a rotary control system for controlling this electrical apparatus.

The invention applies more particularly to rotary control systems for electrical apparatuses, such as circuit breakers. As is known, such systems comprise a rotary control member that can be rotationally displaced between predefined positions associated with distinct electrical states of the electrical apparatus, for example on and off states. For a circuit breaker, for example, these electrical states correspond to the closed state and to the open state. Typically, the electrical apparatus is placed inside an electrical enclosure, on a back wall of this electrical enclosure. A rotary control handle is placed on a door of the enclosure, facing the back wall, to be able to be accessed and activated from the outside of the enclosure by a user. This handle is linked to the rotary member, for example by means of a rigid shaft, for the rotation of the control handle to drive the rotary member in rotation between its predefined positions so as to control the electrical apparatus.

For safety reasons, it is desirable for the rotary member to be able to be locked in a predefined position, typically its position corresponding to the open or off state of the electrical apparatus, when the door of the enclosure is open. This is particularly useful in maintenance operations during which the electrical apparatus is off and the door of the enclosure is open. In effect, it is essential to avoid having the electrical apparatus inadvertently switched back on again, thus powering up an electrical installation on which an operator is currently working.

Control systems are known in which the handle can be locked to prevent the rotation thereof. An example of such a handle is described in the patent EP 1 791 149 B1. One drawback of these systems is that they are inoperative when the door is open, because the handle is then no longer linked to the rotary member. The locking of the handle does not prevent the rotary member from being directly operated and therefore the electrical apparatus from being returned to its active state.

It is not always possible to place an additional lockable handle directly on the rotary control member inside the enclosure, because that would complicate the insertion of the rigid shaft of the control handle into the rotary member.

Also known are control systems in which a lock is incorporated on the rotary member. That has the drawback of increasing the bulk and the complexity of the system. Furthermore, such a lock can typically be used only by a small number of keys specifically associated with this lock which must therefore be supplied to each user of the lock. Manufacturing and packaging such a system for its delivery to customers are thus complicated and costly.

It is these drawbacks that the invention seeks more particularly to remedy, by proposing a control system for an apparatus provided with a rotary control member with a simplified design and a reduced bulk and which simply allows for locking in one of its positions.

To this end, the invention proposes a rotary control system for an apparatus, this system comprising:

- a rotary control member, rotationally mobile about a first fixed axis, between first and second positions,
- a rotary control handle, intended to be secured in rotation with the rotary member about the first axis,

- a blocking device, that can be displaced selectively, when the rotary member is in its first position, between:
  - a blocking configuration, in which it prevents the displacement of the rotary member to its second position, and
  - a release configuration, in which it allows the displacement of the rotary member to its second position.

This system is characterized in that it further comprises a locking plate, rotationally mobile about a first axis relative to the rotary member, when the rotary member is in its first position, between:

- a locking position, in which a first through orifice of the rotary member is superposed with a second through orifice of the locking plate, these first and second orifices then forming an opening capable of receiving a locking tool rotationally securing the rotary member with the locking plate about the first axis, and
- an unlocking position, in which the first and second orifices are offset relative to one another and together do not form the opening, and in that the locking plate is configured to switch the blocking device between its blocking and release configurations when it is displaced between its respectively locked and unlocked positions.

By virtue of the invention, to block the rotary member in its first position, it is sufficient to rotationally displace the locking plate until the first and second orifices are superposed with one another to form the opening. By doing this, during the displacement of the locking plate, the blocking device is simply displaced to its blocking configuration, thus preventing a displacement of the rotary control member. It is then sufficient to insert a locking tool, such as a padlock, through the opening to prevent a rotational displacement of the locking plate. The blocking device is therefore capable of being held in its blocking configuration, thus preventing the rotary control member from being displaced to its second position.

In this way, the locking can be done simply with a padlock, without it being necessary to incorporate a dedicated lock. The design of the system is thus simplified thereby, as is the manufacture thereof in industrial conditions. In addition, that provides for a greater flexibility of use, because it is the user who brings his or her own locking tool, any locking tool being able to be used. On the contrary, in the case of a lock, only the keys previously associated with this lock can be used, which complicates the use when several different users have to work on the apparatus and there are more of these users than there are keys available.

According to advantageous but not obligatory aspects of the invention, such a locking system can incorporate one or more of the following features, taken in any technically allowable combination:

- the blocking device comprises a pin borne by the rotary member, this pin being translationally mobile relative to the rotary member, between:
  - a deployed position, in which a first end of this pin is received in a hole formed on a fixed frame of the control system and prevents the rotation of the rotary member, the blocking device then being in its blocking configuration, and
  - a retracted position, in which the first end of the pin is outside of the hole and allows the rotation of the rotary member, the blocking device then being in its release configuration, and a return member exerting on the pin a return force to its retracted position, and a bearing zone, borne by the locking plate and configured to push the pin to its deployed position, by bearing on a second end of the pin opposite the first end, when the locking plate is displaced to its locked position.

the bearing zone is a plane that is inclined relative to a main geometrical plane of the locking plate.

the return member comprises a spring.

the rotary handle and the rotary member are secured by means of a shaft, while the rotary member comprises a cavity receiving an end of this shaft and a part for fixing the shaft to the rotary member and the locking plate comprises a protective blade which protrudes from the locking plate, this protective blade being shaped to cover the fixing part only when the locking plate is in its locked position.

the rotary member comprises a groove formed on one of its outer faces and emerges on a volume at least partly delimited by an inner wall of the rotary member, while the locking plate comprises a claw which has a retaining portion, the claw being inserted into the groove such that the retaining portion bears on a rear face of a body of the rotary member, the opening thickness of a main part of the groove being less than the width of the retaining portion of the claw to prevent a translational displacement of the locking plate along the first axis relative to the rotary member.

the groove comprises a secondary part having an opening thickness greater than the width of the retaining portion of the claw, this secondary part defining a mounting position of the locking plate, distinct from the locking and unlocking positions and in which the locking plate can be translationally displaced relative to the rotary member along the first axis.

the locking plate is formed to prevent, once the claw is inserted into the groove, a displacement to its mounting position.

the locking plate comprises a straight part formed to come into abutment on the pin when this pin is in its retracted position and when the locking plate is displaced to its mounting position.

According to another aspect, the invention relates to an electrical enclosure comprising a controllable electrical apparatus housed inside the enclosure, and a rotary control system coupled to the electrical apparatus to control the electrical apparatus from the outside of the enclosure, the control system being as described previously.

The invention will be better understood and other advantages thereof will become more clearly apparent in light of the following description of an embodiment of a locking system given purely by way of example and with reference to the attached drawings in which.

Figure 1:
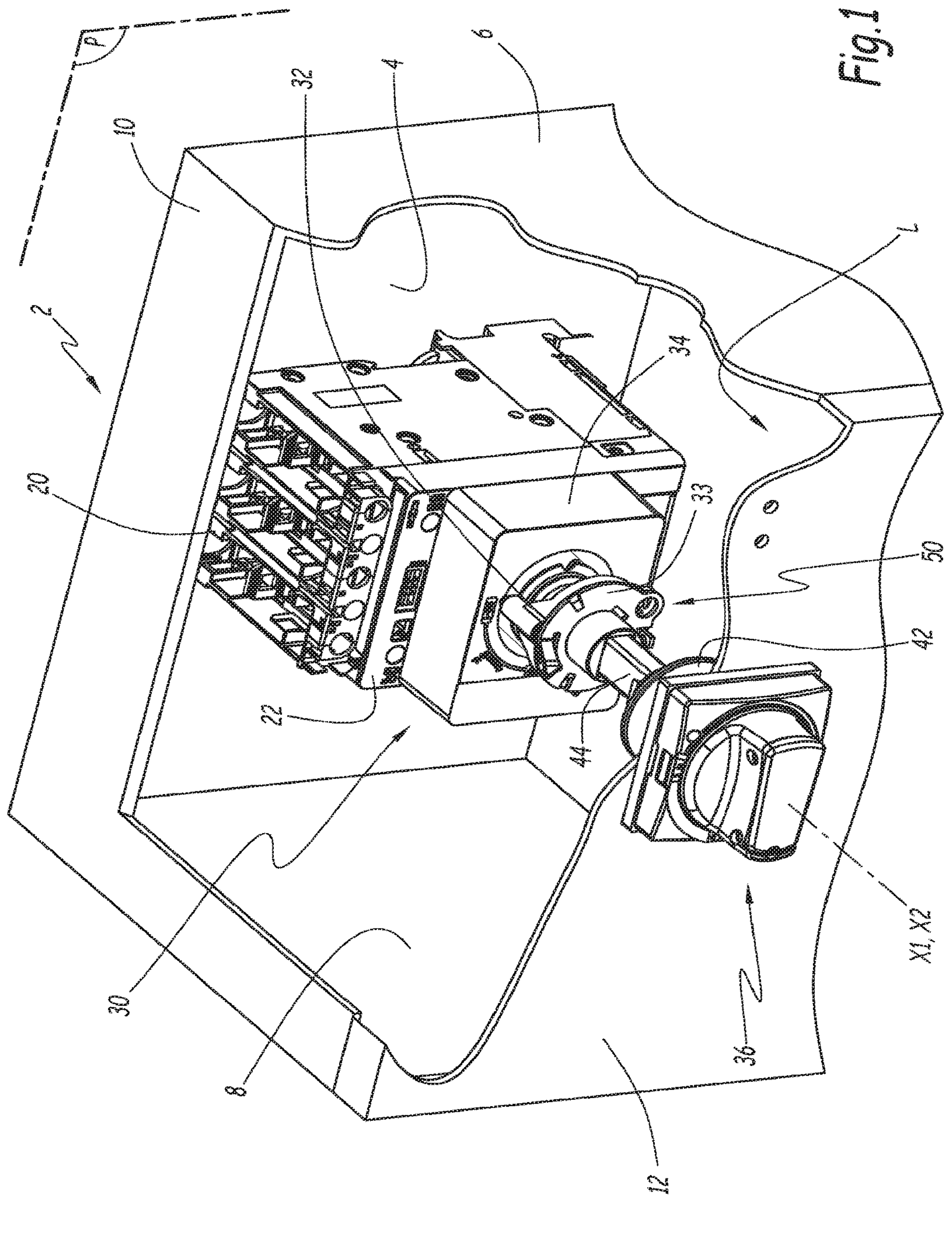
FIG. 1 is a perspective schematic representation, by a cutaway view, of an electrical enclosure comprising a controllable electrical apparatus and a rotary control system according to the invention.

FIG. 1 represents an electrical enclosure 2. The enclosure 2 comprises a back wall 4 which extends essentially in a geometrical plane P. The enclosure 2 also comprises top and bottom lateral walls 6, 8 and 10. The walls 6, 8 and 10 extend at right angles to the geometrical plane P. The walls 4, 6, 8 and 10 define a housing L.

The enclosure 2 also comprises a door 12 which can be displaced, reversibly, between an open position, in which the housing L is open to the outside of the enclosure 2 and a closed position, in which the door 12 closes the housing L. For example, the door 12 is mounted to pivot along an axis which extends parallel to the plane P such that, in its closed position, the door 12 faces the back wall 4. For example, the door 12 is mounted to pivot by means of a hinge fixed to an outer edge of one or other of the lateral walls 6 or 8. The enclosure 12 here has a trapezoid form with parallelepipedal base. The walls 4, 6, 8 and 10 and the door 12 are, for example, made of metal.

In this description, unless stipulated otherwise, the “rear face” of an element corresponds to the face of this element which is turned towards the back wall 4 and which extends essentially to the plane P. The “front face” of an element is the rear face and which is turned towards the door 12 when this door is closed.

The electrical enclosure 2 further comprises an electrical apparatus 20 which is fixedly arranged inside the housing L on the back wall 4. For example, the electrical apparatus 20 is electrically coupled to electrical conductors of an electrical circuit to be protected and which enter into the enclosure 2. To simplify FIG. 1, these electrical conductors are not illustrated.

The electrical apparatus 20 can be switched, selectively and reversibly, between two distinct electrical states, for example an “ON” state and a “OFF” state. Here, the electrical apparatus 20 is a circuit breaker.

The apparatus 20 can be switched between its electrical states by means of a switch, incorporated in the apparatus 20 and arranged on a front face 22 of the apparatus 20. The switch is, here, a rotary switch that is turned about a fixed axis X1 to switch the electrical apparatus 20 between its electrical states. The axis X1 extends at right angles to the geometrical plane P.

The electrical enclosure 2 further comprises a rotary control system 30 of the apparatus 20, to control the switching of the electrical apparatus 20 between its electrical states from the outside of the enclosure 2 when the door 12 is closed. The control system 30 is, here, fixed to the front face 22 of the apparatus 20 and is mechanically coupled with the switch of the electrical apparatus 20. To this end, the control system 30 comprises a rotary control member 32, a locking plate 33 and a fixed frame 34.

The frame 34 is, here, mounted fixedly and with no degree of freedom on the front face 22 of the apparatus 20.

The rotary member 32 is rotationally mobile, relative to the frame 34, about the axis X1 between stable and distinct first and second positions. Here, the rotary member 32 is mounted to be rotationally mobile about this axis X1 on the frame 34. The rotary member 32 is described in more detail hereinbelow.

In this example, the rotary member 32 is, here, mechanically coupled in rotation with this rotary switch about the axis X1. According to a variant, the switch is a lever, or rocker arm, that can be displaced in translation by exerting a force along a line which extends parallel to the plane P. In this case, the frame 34 advantageously encloses a motion transmission system which converts the rotation of the rotary member 32 about the axis X1 into a translation force along the vertical line to switch over the switch.

The control system 30 further comprises a rotary control handle 36 which is intended to be secured in rotation with the rotary member 32 about the axis X1. The handle 36 is mounted on the door 12, here facing the member 32.

The handle 36 comprises a mobile part 38 that can be rotationally displaced between two distinct positions about an axis X2, which extends at right angles to the door 12, and a fixed base 40 which is fixedly mounted on the door 12. The handle 36 is linked to a coupling 42 secured in rotation about the axis X2 with the mobile part 38.

In this description, the rotational displacement of the handle 36 refers to the rotational displacement of the mobile part 38.

When the handle 36 is mounted on the enclosure 2, the axis X2 is parallel to the axis X1. In this example, the axes X1 and X2 then coincide. In a variant, the axes X1 and X2 do not coincide, but are offset relative to one another, for example because the handle 36 is not facing the member 32. In this case, an appropriate mechanism is used to transmit the motion from the handle 36 to the member 32.

The control system 30 further comprises a shaft 44 with polygonal section securely mounted to rotate with the rotary member 32. The shaft 44 extends essentially along the axis X1. The shaft 44 makes it possible to secure the handle 36 in rotation with the rotary member 32 when the door 12 is closed. To this end, the shaft 44 bears the coupling 42 on one of its ends. The coupling 42 is fixedly mounted on the shaft 44 and can be selectively disconnected from the mobile part 38 of the handle 36.

More specifically, when the door 12 is closed, the coupling 42 secures, in rotation about the axis X1, the mobile part 38 of the handle 36 with the shaft 44 and therefore with the member 32.

When the door 12 is in its open position, the axis X2 is no longer aligned with the axis X1. The handle 36 is in a separated position, as is the coupling 32. The mobile part 38 of the handle 36 is disconnected from the coupling 42. The handle 36 is therefore mechanically uncoupled from the rotary member 32.

In a variant, the coupling 42 is borne by the handle 36, and remains secured to the mobile part 38. When the door 12 is open, the shaft 44 is separated from the coupling 42.

The shaft 44 is, here, fixedly mounted secured in rotation with the rotary member 32. For example, the rotary member 32 comprises a cavity 46 with polygonal section complementing that of the shaft 44 and formed on a central portion of this rotary member 32 and in which an end of the shaft 44 is received. The rotary member 32 comprises a fixing part 48, such as a cone-point set screw, to hold the shaft 44 fixedly in the cavity 46 and thus prevent any translational displacement along the axis X1 tending to separate the shaft 44 from the cavity 46.

Thus, when the door 12 is open, the shaft 44 remains secured to the rotary member 32.

In this way, when the door 12 is closed, the rotation of the handle 36 rotationally drives the member 32. Here, the switching of the member 32 between the two positions is done by turning the handle 36 by an angle of 90° about the axis of rotation X1.

Figure 2:
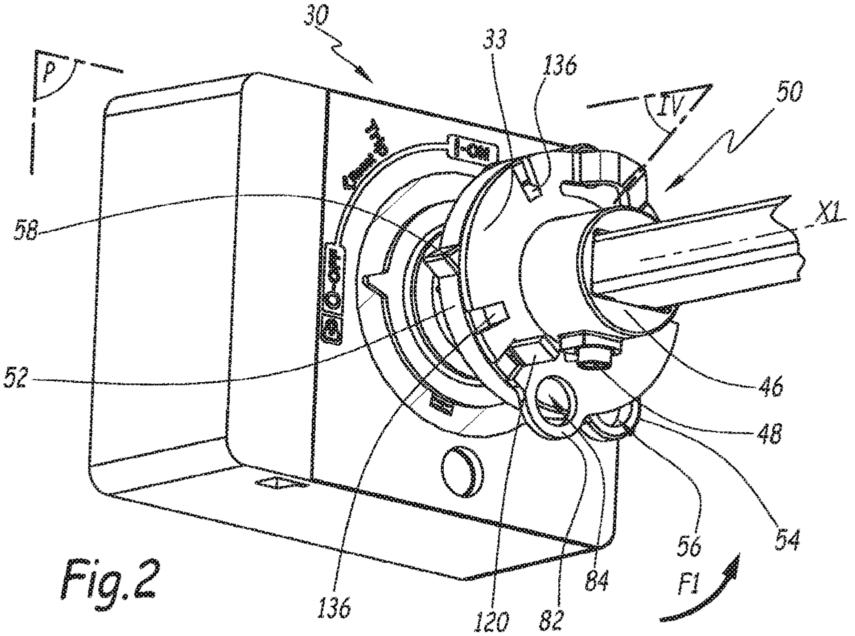
FIGS. 2 and 3 are schematic representations, according to close-up views, of a portion of the rotary control system according to the invention for the electrical enclosure of FIG. 1.
Figure 3:
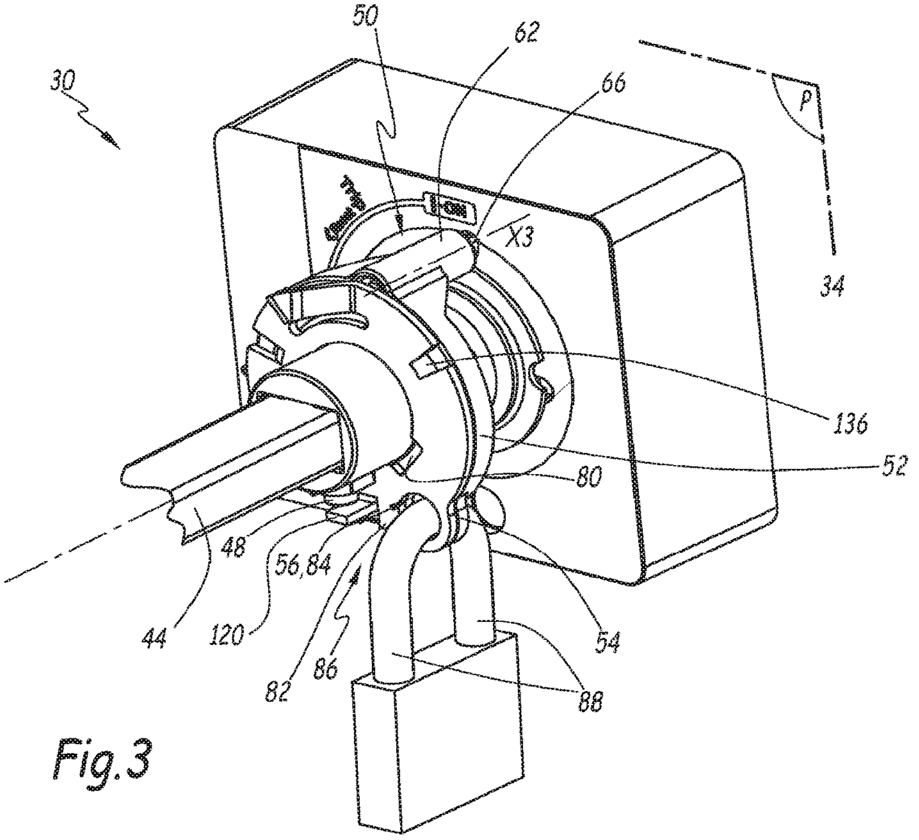

The control system 30 further comprises a blocking device 50, illustrated in FIGS. 2 and 3. In this example, the aim is to be able to lock the rotary member 32 in its first position, that is to say that corresponding to the off state of the apparatus 20. To this end, when the rotary member 32 is in its first position, the device 50 can be displaced selectively between a blocking configuration and a release configuration.

In the blocking configuration, the device 50 prevents the displacement of the rotary member 32 to its second position. In the release configuration, the device 50 allows the displacement of the rotary member 32 to its second position.

The rotary member 32 has a body 52 of which the orthogonal geometrical projection in the geometrical plane P essentially takes the form of a disk. The rotary member 32 comprises a ring 54 which defines a through opening 56, or orifice. Here, this ring extends parallel to the plane P.

Advantageously, the member 32 comprises a marker 58 formed on an edge of the body 52 and which makes it possible to visually indicate the current position of the rotary member 32. For example, the marker 58 takes the form of an arrow. The frame 34 is then covered with visual indicators which are positioned such that the marker 58 points to one or other of these indicators, when the rotary member 32 is in one or other of its positions.

For example, the ring 54 is formed on a peripheral edge of the body 52, by piercing the body 52.

Figure 4:
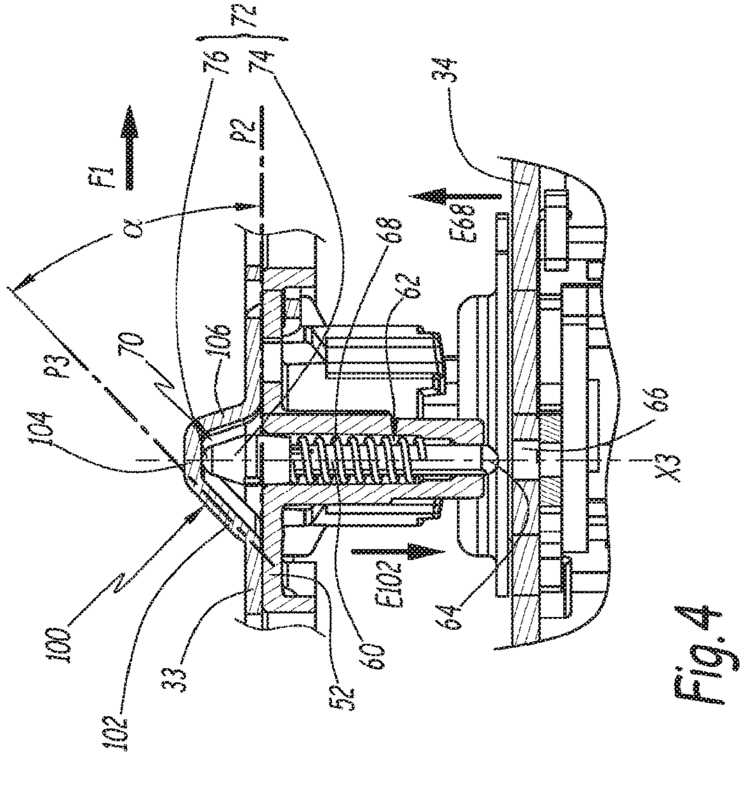
FIG. 4 is a schematic cross section, in the cutting plane IV of FIG. 2, of a portion of the rotary control system according to the invention.

The blocking device 50 here comprises a pin 60, mobile and borne by the member 32, illustrated in FIG. 4. This pin 60 is partially received in a housing 62 formed on the body 52.

The pin 60 is translationally mobile between deployed and retracted positions relative to the member 32 along an axis X3 at right angles to the plane P and secured to the member 32.

In the deployed position, a distal end 64 of the pin 60 is received in a blind hole 66 formed on the frame 34. For example, the pin 60 penetrates into this hole to a length of at least 5 mm, even 8 mm. Thus, the pin 60 prevents the rotation of the rotary member 32 about the axis X1 relative to the frame 34. The blocking device 50 is then said to be in its blocking configuration.

In its retracted position, the distal end 64 of the pin 60 is located outside of the hole 66, for example by being retracted into the housing 62. Because of the absence of the pin 60 in the hole 66, the rotary member 32 is free to move rotationally about the axis X1 relative to the frame 34. The blocking device 50 is said to be in its release configuration.

The device 50 further comprises an elastic return member 68 exerting on the pin 60 a return force to its retracted position. Here, the return member 68 is housed in the housing 62 by being fixed on the one hand to an inner wall of the housing 62 and on the other hand to the pin 60. For example, the return member 68 is a helical spring.

The pin 60 here comprises a body of essentially cylindrical form with circular base and which extends along the axis X3. The pin 60 has, on an end 70 opposite the distal end 64, a head 72 formed by a tapered portion 74 and a terminal portion 76. The portion 74 is placed between the body of the pin 60 and the portion 76 and here takes the form of a truncated cone of axis X3. The outer walls of this portion 74 exhibit an angle relative to the axis X3 which is, for example, 45°. The pin 60 is here produced in metal. The terminal portion 76 here has a rounded form, for example a half-sphere. The housing 62 here has a cylindrical form of axis X3 with an internal diameter greater than the diameter of the cylindrical body of the pin 60.

In this example, the rotary member 32 is made of metal, for example of an alloy of copper, of zinc and of aluminium, which gives it adequate hardness and rigidity.

The locking plate 33 is rotationally mobile about the axis X1 relative to the rotary member 32. More specifically, when the rotary member 32 is in its first position, the plate 33 can be displaced between locking and unlocking positions by rotation about the axis X1.

The plate 33 is configured to switch the blocking device 50 to its blocking position when it is displaced from its unlocked position to its locked position. Similarly, the plate 33 switches the blocking device 50 from its blocking configuration to its release configuration, when it is displaced from its locked position to its unlocked position.

The plate 33 is here of essentially planar form and extends parallel to the plane P, when it is mounted in the system 30. The plate 33 comprises a central bore through the centre of which passes the axis X1. Thus, the plate 33 is arranged coaxially with the rotary member 32. In this example, the central bore is passed through by the portion of the rotary member 32 which bears the cavity 46. The rear face of the plate 33 is turned towards the front face of the member 32.

The plate 33 further comprises a ring 82 which defines a through orifice 84, for example formed by drilling in the vicinity of an outer edge of the plate 33. This orifice 84 emerges on the front and rear faces of the plate 33. The ring 82 extends in the same geometrical plane as the ring 54, here parallel to the plane P.

When the rotary member 32 is in its first position and the plate 33 is in its locking position, as illustrated in FIG. 3, the orifices 56 and 84 are superposed with one another and form an opening 86 which is capable of receiving, by insertion through this opening 86, a locking tool capable of securing the rotary member 32 in rotation with the locking plate 33 about the axis X1. For example, this locking tool is a padlock. In FIG. 3, a locking tool is schematically represented by the line 88, which represents the shackle of a padlock inserted through the opening 86.

The orifices 56 and 84 are said to be superposed when the orifices 56 and 84 have at least 30%, preferably at least 50%, of their surface area in common. Preferably. the opening 86, when it is formed, has a surface area greater than or equal to 0.5 $cm^2$. Advantageously, the opening 86 has a disk form of diameter greater than or equal to 0.5 cm, preferably to 1 cm, even more preferably to 2 cm. Thus, the known locking tools, such as clamps or padlocks commonly used by electrical maintenance operators, can be inserted through the opening 86.

In the unlocking position, the orifices 84 and 56 are angularly offset relative to one another about the axis X1 and do not form the opening 86, as illustrated in FIG. 2. For example, less than 20% or 15% or 10% of the surface area of the orifice 84 is superposed with the surface area of the orifice 56. In the example, the surface areas of the orifices 56 and 84 are not at all superposed.

The plate 33 comprises a bearing zone 100 which is formed to displace the pin 60 to its deployed position, by bearing on the proximal end 70 of the pin 60, when the plate 33 is displaced from its unlocked position to its locked position.

In this example and as can be seen in FIG. 4, the bearing zone 100 comprises an inclined part 102, or inclined plane, and straight parts 104 and 106. The bearing zone is formed here facing the pin 60, on an outer periphery of the plate 33. The part 102 protrudes from a geometrical plane P2 in which the plate 33 essentially extends, this plane P2 forming a main plane of the plate 33. The inclined part 102 of the plate 33 extends along a geometrical plane P3 which forms, with the geometrical plane P2, an angle α. The angle α lies for example between 30° and 60° and, preferably, between 40° and 50°. In this example, the angle α is equal to 45°. The angle α is preferentially chosen as a function of the angle of inclination of the walls of the tapered portion 74 of the pin 60. When the locking plate 33 is in mounted configuration in the control system 30, the plane P2 is parallel to the plane P.

In this example, the orthogonal projection of the part 102 in the plane P2 extends essentially along a circular arc, here following the periphery of the plate 33. The part 102 here extends between first and second angular positions, moving away from the plane P2 from the first angular position to the second angular position. These angular positions are here defined relative to the geometrical centre of the plate 33. The angle between these first and second angular positions, measured in the plane P2, depends on the travel of the pin 60 and on the angle α.

The parts 102, 104 and 106 are in contact with one another and are, for example, formed of a single piece and with the plate 33. For example, the parts 102, 104 and 106 are formed by localized stamping of the plate 33. In a variant, the part 33 is formed by moulding. The part 104 extends essentially parallel to the plane P2 and couples the part 102 with the part 106.

The part 106 protrudes relative to the plane P2, with an angle relative to this plane P2 strictly greater than 45°, preferably greater than or equal to 55° or to 75°, even, as a variant, at right angles to the plane P2.

The parts 102, 104 and 106 define a housing which receives the end 70 of the pin 60 when it is in its retracted position. The angle α is measured on the side of the part 102 turned towards the interior of the housing. The portion 76 of the pin 60 then comes into abutment against the part 104 when the plate 33 is in its unlocked position, because of the return force E68 exerted by the return member 68. By virtue of the hemispherical form of the terminal portion 76, the contact surface between the proximal end 70 of the pin 60 and the part 104 of the plate 33 is reduced, which limits the friction forces between the plate 33 and the pin 60 when the plate 33 is displaced relative to the rotary member 32.

The part 102 displaces the pin 60 from its retracted position to its deployed position when the plate 33 is displaced from its unlocked position to its locked position by turning the plate 33 relative to the member 32 in the direction represented by the arrow F1 in FIG. 4. The part 102 forms a cam against which the terminal portion 76 slides. As the plate 33 is displaced relative to the rotary member 32, the part 102 exerts a pushing force E102 on the pin 60 directed along the axis X3. This force E102 opposes and exceeds the force E68 exerted by the return member 68 on the pin 60.

When the rotary member 32 is in its first position, the pin 60 is located facing the hole 66 and therefore slides relative to the housing 62 along the axis X3, such that the end 64 penetrates gradually into the hole 66 until the pin 60 is located in its first deployed position. Then, the plate 33 covers the head 72 of the pin and prevents any subsequent displacement of the pin 60 relative to the housing 62.

By contrast, if the rotary member 32 is not in its first position, then the pin 60 cannot be displaced to its deployed position. If the plate 33 is rotated relative to the rotary member 32 to exert the force E102 as described above, the pin 60 is displaced but its distal end 64 comes into abutment against the frame 34. It is not then possible to continue the displacement of the plate 33 to its locked position. Thus, as long as the rotary member 32 is not in its first position, the plate 33 cannot be displaced to its locking position, although it can however here be displaced slightly relative to the rotary member 32 because of the length of the part 104.

For its part, the part 106 prevents a displacement of the plate 33 in an opposite direction as explained hereinbelow.

The length of the part 102 is advantageously chosen such that the rotational motion of the plate 33 between its unlocked and locked positions is sufficient to completely displace the pin 60 from its retracted position to its deployed position.

Thus, when the opening 86 is formed, the pin 60 is completely in its retracted position. The locking tool 88 is inserted into the opening 86, the plate 33 is secured in rotation with the member 32 about the axis X1 and the pin cannot be displaced from its current retracted position, immobilizing the rotary member 32 in its first position.

Advantageously, the plate 33 comprises a protective blade 120 which protrudes relative to the outer face of the plate 33. The blade 120 is formed to externally cover the part 48 only when the plate 33 is in its locked position, as illustrated in FIG. 3. For example, the blade 120 protrudes along an axis parallel to the axis X1. The blade 120 blocks the access to the part 48 thus preventing any dismantling of the shaft 44. Such dismantling is not desirable because it would enable a user to separate the constituent elements of the system 30 and therefore circumvent the locking provided by the member 88.

When the plate 33 is in the unlocked position, the blade 120 is separated from the fixing part 48 and allows access to this part, as illustrated in FIG. 2.

The blade 120 is thus positioned at a predefined location so as to cover the fixing part 48 only when this plate 33 is in its locking position. For example, the angular offset, measured parallel to the plane P and about the axis X1, between the protective blade 120 and the geometrical centre of the orifice 84, is the same as the angular offset, measured in the same way, between the fixing part 48 and the geometrical centre of the orifice 56.

Figure 5:
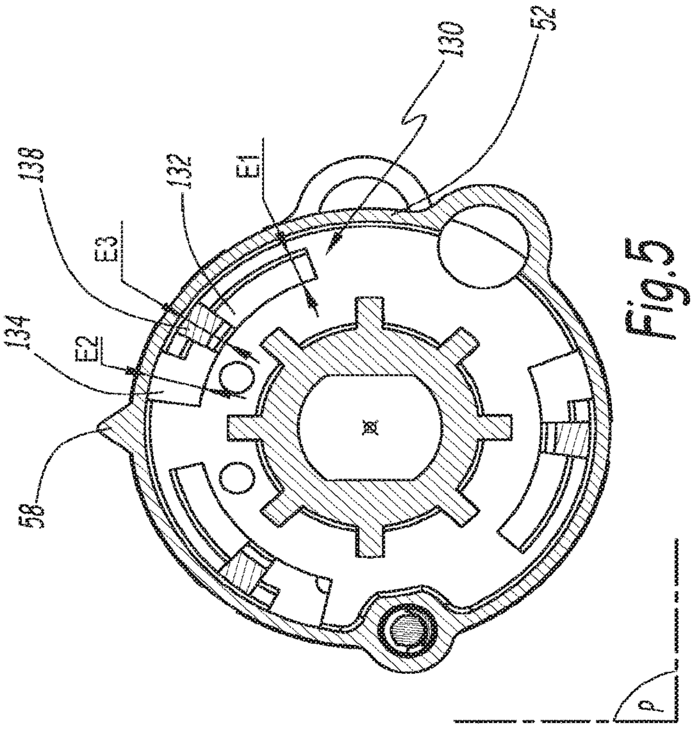
FIG. 5 is a schematic representation, according to a rear view, of a locking plate of the rotary control system according to the invention.

Advantageously, the rotary member 32 comprises a groove 130 formed on one of its outer faces and emerging on a volume at least partly delimited by an inner wall of the rotary member 32, as illustrated in FIG. 5. Here, the groove 130 is a slot which passes through the body 52 and which emerges on either side of this body 52 on opposite faces of this body 52. The groove 130 comprises a main part 132 and a secondary part 134. The groove 130 extends here parallel to the geometrical plane P.

The main part 132 has a first opening thickness E1, measured on a radial axis of the body 52 parallel to the plane P between opposites edges of this main part of the groove 130. The secondary part has a second radial thickness E2, measured similarly, parallel to the plane P between opposite edges of this secondary part 134. The thickness E2 is greater than the thickness E1.

For its part, the plate 33 comprises a claw 136 protruding relative to the rear face of the plate 33. The claw 136 is mounted to slide in the groove 130 when the plate 33 is in a state assembled with the control system 30. More specifically, the claw 136 is inserted into the groove 130 such that a retaining portion 138 of the claw 136 bears on the rear face of the body 52. The portion 138 has a width E3 which is greater than the opening thickness E1 of the main part 132 of the groove 130. Thus, the portion 138 prevents any translational displacement of the plate 33 relative to the rotary member 32 on the axis X1. When the plate 33 is displaced between the locked and unlocked positions, the claw 136 is displaced only along the main part 132 of the groove 130.

In this example, the plate 33 comprises three claws 136 and the member 32 comprises three grooves mutually identical grooves 130 each receiving a corresponding claw 136. The claws 136 and the grooves 130 are preferably evenly distributed about the axis X1, at 120° in the example.

The secondary part 134 defines a mounting position of the plate 32 distinct from the locking and unlocking positions. In this mounting position, the plate 33 can be displaced translationally relative to the rotary member 32 on the axis X1 to insert the or each claw 136 into the corresponding groove 130.

Advantageously, the part 106 of the zone 100 prevents the plate 33 from returning to its mounting position once the claw 136 is inserted into the groove 130. Because this part 106 protrudes relative to the plane P2 as described previously, and therefore parallel to the axis X3, it does not make it possible to translationally displace the pin 60 from its retracted position to its deployed position by turning the plate 33, in the manner of what is done with the inclined part 102.

An example of use of the control system 30 will now be described with reference to FIGS. 1 to 5.

Initially, the plate 33 is in a state disassembled from the system 30. The pin 60 and the return member 68 are previously mounted in the device 30. The plate 33 is first of all mounted on the rotary member 32, for example by threading the portion of the rotary member 32 bearing the cavity 46 through the central orifice 80 of the plate 33. The plate 33 is turned so that the claw 136 is arranged facing the secondary part 134 of the groove 130. The plate 33 is then in its mounting position. The plate 33 is then pushed towards the member 32 along the axis X1. By doing that, the claw 136 enters into the groove 130. At the same time, the proximal end 70 of the pin 60 is pushed back by the plate 33 which drives a displacement of the pin 60 into its retracted position.

Then, the plate 33 is rotated relative to the rotary member 32 so as to bring the plate 33 into its unlocking position, as illustrated in FIG. 4. For example, the plate 33 is turned in the direction illustrated by the arrow F1 during this rotation, the claw 136 leaves the secondary part 134 to penetrate into the main part 132 of the groove 130. Simultaneously, the plate 33 is displaced relative to the pin 60 until the housing defined by the parts 102, 104 and 106 of the plate 33 is brought to face the proximal end 70 of the pin 60. Then, the plate 33 is no longer in contact with the end 70 and no longer opposes the force E68 exerted by the member 68. The pin 60 is pushed to its retracted position until it arrives in abutment against the straight part 104 of the plate 33. Because of the straight part 106, it is no longer possible to impose on the plate 33 a rotational motion in the reverse direction to revert to the mounting position. Thus, a situation in which the plate 33 cannot be separated along the axis X1 from the rotary member 32 when it is in the locking position, which would render the blocking exerted by the blocking device 50 on the rotary member 32 inoperative, is avoided. If that were to occur, the rotary member 32 could then be manipulated, inadvertently or with ill-intent, to switch the electrical apparatus 20 to its on state in an unauthorized manner.

Once the plate 33 is in its unlocked position, the blocking device is in its release configuration. The rotary member 32 can therefore be freely displaced between its first and second positions to switch the electrical apparatus between its on and off states. For example, the door 12 is closed and the apparatus 20 is controlled by means of the handle 36 from the outside of the enclosure 2.

Then, to lock the rotary member 32 in its first position, the door 12 is opened. The plate 33 is turned about the axis X1 relative to the rotary member 32, for example manually, until the orifices 84 and 56 overlap and form the opening 86. At the same time, the bearing zone 100 is displaced until the inclined part 102 comes into contact with the head 72 of the pin 60, thus exerting the force E102 as described previously. The progressive rotation of the plate 33 displaces the pin 60 to its deployed position in the hole 66. At the end of the rotation, the plate 33 is in its locked position, as illustrated in FIG. 3. The pin 60 is in its deployed position and prevents any rotational displacement of the rotary member 32 relative to the frame 34.

That therefore prevents the electrical apparatus 20 from being switched to its electrical on state. In this locked position, the orifices 56 and 84 are superposed with one another and together form the opening 86. A user can therefore easily insert a locking member 88 into the opening 86. As long as this member 88 is present, the plate 33 is held in its locked position rendering any displacement relative to the member 32 impossible.

When a user removes the locking member 88, the plate 33 can once again be displaced relative to the rotary member 32. The plate 33 is then turned in an opposite direction of rotation and the zone 100 is displaced in a direction of displacement opposite to that illustrated by the arrow F1. Under the force E68, the pin 60 is displaced to its retracted position until it arrives in abutment against the part 104. At the same time, the orifices 84 and 56 move away from one another, rendering the insertion of a locking tool to secure the plate 33 and the rotary member 32 together impossible. The plate 33 is then in its unlocked position, as illustrated in FIG. 2. The rotary member 32 can be freely displaced to its second position to switch the electrical apparatus 20 to its on state.

Figure 6:
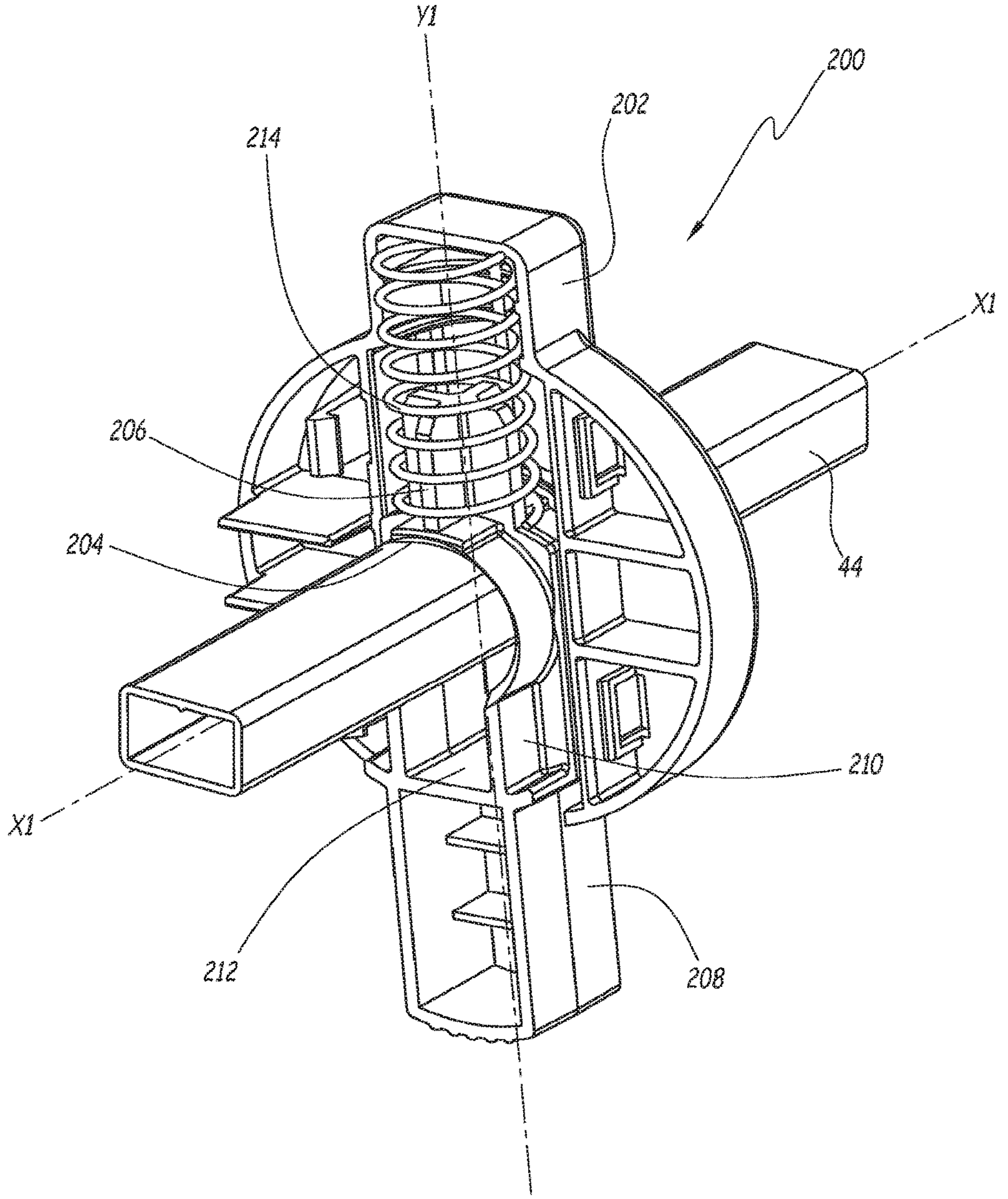
FIG. 6 is a schematic representation, according to a cutaway view, of an additional handle for use in the rotary control system of FIG. 1.

Advantageously, the control system 30 comprises an additional control handle 200, as illustrated only in FIG. 6. The handle 200 is mounted on the shaft 44 inside the enclosure 2. This handle 200 is distinct from the handle 36. The handle 200 is configured to facilitate a rotational displacement of the shaft 44 about the axis X1 by a user. It also makes it possible to prevent this rotation from being inadvertent.

The handle 200 comprises an outer body 202 provided with a central bore 204 allowing the passage of the shaft 44. The handle 200 further comprises a mobile part 206 that can be translationally displaced relative to the body 202 along an axis Y1 secured to the outer body 202 and at right angles to the axis X1. The mobile part 206 comprises an outer portion 208 and jaws 210 defining a housing 212.

The mobile part 202 can be displaced, along the axis Y1, between a first position in which the shaft 44 is separated from the jaws 210 and is outside of the housing 212, and a second position in which the shaft 44 is gripped by the jaws 210 inside the housing 212.

The handle 200 further comprises a return member 214, such as a spring, configured to exert a return force on the mobile part 206 along the axis Y1 to bring the mobile part 206 back to its first position.

When the mobile part 206 is in its first position, the handle 200 is rotationally mobile relative to the shaft 44 about the axis X1. Thus, moving the handle 200 does not result in any corresponding rotation of the shaft 44.

Advantageously, the handle 200 nevertheless exerts a non-zero force on the shaft 44, to avoid having the handle 200 slip freely on the shaft 44, which makes it possible to keep it in a position desired by a user.

When the mobile part 206 is in the second position, the handle 200 is secured in rotation with the shaft 44 about the axis X1, by virtue of the action of the jaws 210 on the shaft 44. A rotational movement of the handle 200 therefore brings about a corresponding rotational movement of the shaft 44 about the axis X1.

The switchover between the first and second positions of the mobile part 206 is produced by exerting a pressure on the outer part 208 along the axis Y1. When this pressure is sufficiently high, it opposes the return force by the return member 214 and displaces the mobile part to its second position. When no pressure is exerted on the outer part 208, the mobile part 206 regains its first position under the effect of the return member 214.

Thus, the handle 200 can be used only when a force is applied on the outer part 208. In this way, there is an assurance that the rotation of the handle 200 is the result of a deliberate action on the part of a user and not an inadvertent movement exerted on the handle 200.

The handle 200 can be implemented independently of the control system 30 described previously.

In a variant, the apparatus 20 is not an electrical apparatus. It can be a controllable valve.

The different variants and the different embodiments of the invention can be combined with one another to form novel embodiments of the invention.

The invention claimed is:

1. A rotary control system for an apparatus, said system comprising:
- an enclosure,
- a rotary control member, disposed within the enclosure and configured to be rotationally mobile about a first fixed axis, between first and second positions,
- a rotary control handle, disposed on an outer surface of the enclosure and configured to be secured in rotation with the rotary member about the first axis,
- a blocking device, disposed within the enclosure and configured to be displaced selectively, when the rotary member is in its first position, between:
  - a blocking configuration, in which the blocking device prevents the displacement of the rotary member to its second position, and
  - a release configuration, in which the blocking device allows the displacement of the rotary member to its second position,
- said rotary system further comprises a locking plate, disposed within the enclosure and configured to be rotationally mobile about the first axis relative to the rotary member, when the rotary member is in its first position, between:
  - a locking position, in which a first through orifice of the rotary member is superposed with a second through orifice of the locking plate, said first and second orifices forming an opening configured to receive a locking tool rotationally securing the rotary member with the locking plate about the first axis, and
  - an unlocking position, in which the first and second orifices are offset relative to one another and together do not form the opening, and
- wherein the locking plate is configured to switch the blocking device between its blocking and release configurations when the locking plate is displaced between its respectively locked and unlocked positions.

2. The control system according to claim 1, wherein the blocking device comprises:
- a pin borne by the rotary member, said pin being translationally mobile relative to the rotary member, between:
  - a deployed position, in which a first end of this pin is received in a hole formed on a fixed frame of the control system and prevents the rotation of the rotary member, the blocking device then being in its blocking configuration, and a retracted position, in which the first end of the pin is outside of the hole and allows the rotation of the rotary member, the blocking device then being in its release configuration, a return member exerting on the pin a return force to its retracted position, a bearing zone, borne by the locking plate and configured to push the pin to its deployed position, by pressing on a second end of the pin opposite the first end, when the locking plate is displaced to its locked position.

3. The control system according to claim 2, wherein the bearing zone is a plane that is inclined relative to a main geometrical plane of the locking plate.

4. The control system according to claim 2, wherein the return member comprises a spring.

5. The control system according to claim 1, wherein the rotary handle and the rotary member are secured with a shaft, wherein the rotary member comprises a cavity receiving an end of said shaft and a part for fixing the shaft to the rotary member, and wherein the locking plate comprises a protective blade which protrudes from the locking plate, said protective blade being shaped to cover the fixing part only when the locking plate is in its locked position.

6. The control system according to claim 1, further comprising:

the rotary member comprises a groove formed on one of its outer faces and emerging on a volume at least partly delimited by an inner wall of the rotary member, the locking plate comprises a claw which has a retaining portion, the claw being inserted into the groove such that the retaining portion bears on a rear face of a body of the rotary member, the opening thickness of a main part of the groove being less than the width of the retaining portion of the claw to prevent a translational displacement of the locking plate along the first axis relative to the rotary member.

7. The control system according to claim 6, wherein the groove comprises a secondary part having an opening thickness greater than the width of the retaining portion of the claw, said secondary part defining a mounting position of the locking plate, distinct from the locking and unlocking positions and in which the locking plate can be translationally displaced relative to the rotary member along the first axis.

8. The control system according to claim 7, wherein the locking plate is formed to prevent, once the claw is inserted into the groove, a displacement to its mounting position.

9. The control system according to claim 8, wherein the locking plate comprises a straight part formed to come into abutment on the pin when said pin is in its retracted position and when the locking plate is displaced to its mounting position.

10. The rotary control system according to claim 1, further, comprising:

a controllable electrical apparatus housed inside the enclosure, wherein said rotary control system is coupled to the electrical apparatus to control the electrical apparatus from the outside of the enclosure via the rotary control handle.

* * * * *